(12) United States Patent
Cabanillas et al.

(10) Patent No.: US 8,773,204 B2
(45) Date of Patent: Jul. 8, 2014

(54) AMPLIFIER WITH REDUCED SOURCE DEGENERATION INDUCTANCE

(75) Inventors: Jose Cabanillas, San Diego, CA (US); Calogero D Presti, San Diego, CA (US); Norman L Frederick, Jr., San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 40 days.

(21) Appl. No.: 13/372,648

(22) Filed: Feb. 14, 2012

(65) Prior Publication Data

US 2013/0207732 A1    Aug. 15, 2013

(51) Int. Cl.
*H03F 1/14*  (2006.01)
(52) U.S. Cl.
USPC .......................................... 330/292; 330/283
(58) Field of Classification Search
USPC ............................ 330/292, 283, 302, 285, 296
See application file for complete search history.

(56) References Cited

U.S. PATENT DOCUMENTS

| | | | |
|---|---|---|---|
| 6,300,827 B1 * | 10/2001 | King | 330/65 |
| 7,705,684 B2 | 4/2010 | Degani et al. | |
| 7,881,679 B1 | 2/2011 | Faravash et al. | |
| 8,023,902 B2 | 9/2011 | Moloudi et al. | |
| 8,299,856 B2 * | 10/2012 | Blair | 330/302 |
| 2006/0043425 A1 | 3/2006 | Sakurai | |
| 2006/0189286 A1 | 8/2006 | Kyu et al. | |
| 2010/0259319 A1 | 10/2010 | Chan et al. | |

OTHER PUBLICATIONS

Aoki, et al., "Fully Integrated CMOS Power Amplifier Design Using The Distributed Active-Transformer Architecture", IEEE Journal of Solid-State Circuits, vol. 37, No. 3, Mar. 2002, pp. 371-383.
International Search Report and Written Opinion—PCT/US2013/025967—ISA/EPO—Apr. 23. 2013.
Zarifi M. H., et al., "Design of an input 5 matching network for RF CMOS LNAs using stack inductors", Computer and Communication Engineering, 2008. ICCCE 2008. International Conference on, IEEE, Piscataway, NJ, USA, May 13, 2008, pp. 672-676, XP031292871, ISBN: 978-1 4244-1691-2.

* cited by examiner

*Primary Examiner* — Henry Choe
(74) *Attorney, Agent, or Firm* — Ramin Mobarhan

(57) ABSTRACT

Techniques for reducing undesired source degeneration inductance are disclosed. In an exemplary design, an apparatus includes first and second connections. The first connection includes a first parasitic inductance acting as a source degeneration inductance of an amplifier. The second connection includes a second parasitic inductance magnetically coupled to the first parasitic inductance to reduce the source degeneration inductance of the amplifier. The amplifier (e.g., a single-ended power amplifier) may be coupled to circuit ground via the first connection. An impedance matching circuit may be coupled to the amplifier and may include a circuit component coupled to circuit ground via the second connection. The first connection may be located sufficiently close to (e.g., within a predetermined distance of) the second connection in order to obtain the desired magnetic coupling between the first and second parasitic inductances.

16 Claims, 8 Drawing Sheets

AMPLIFIER WITH REDUCED SOURCE DEGENERATION INDUCTANCE

BACKGROUND

I. Field

The present disclosure relates generally to electronics, and more specifically to amplifiers having improved performance.

II. Background

A wireless device (e.g., a cellular phone or a smart phone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an output RF signal having the proper output power level, and transmit the output RF signal via an antenna to a base station. For data reception, the receiver may obtain a received RF signal via the antenna and may condition and process the received RF signal to recover data sent by the base station.

The transmitter may include various circuits such as a power amplifier. The performance of the power amplifier may be affected by various factors such as the circuit design of the power amplifier, the transistors used to implement the power amplifier, etc. The performance of the power amplifier may also be affected by other factors such as parasitic, which may have a large impact on performance.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for reducing undesired source degeneration inductance of amplifiers and other active circuits are described herein. Source degeneration inductance is inductance between a source/emitter of a transistor and circuit ground. Source degeneration inductance may be desired in some amplifiers (e.g., low noise amplifiers) in order to improve linearity, reduce noise, and/or obtain other benefits. In such an amplifier, an inductor of a suitable value may be purposely coupled between a source/emitter of a transistor and circuit ground to obtain source degeneration inductance. However, source degeneration inductance may be undesired in some amplifiers (e.g., power amplifiers) since it can reduce amplifier gain and/or degrade performance. Undesired source degeneration inductance may result from parasitic and/or other phenomena and may be mitigated as described below.

The techniques for reducing undesired source degeneration inductance described herein may be used for amplifiers of various types, such as power amplifiers, driver amplifiers, variable gain amplifiers, etc. The techniques may also be used for other active circuits such as mixers, oscillators, etc. For clarity, the techniques are described below for a power amplifier. The techniques may also be used for wireless devices of various types such as cellular phones, smart phones, tablets, personal digital assistants (PDAs), handheld devices, wireless modems, laptop computers, smartbooks, netbooks, cordless phones, wireless local loop (WLL) stations, Bluetooth devices, consumer electronic devices, etc.

Figure 1:
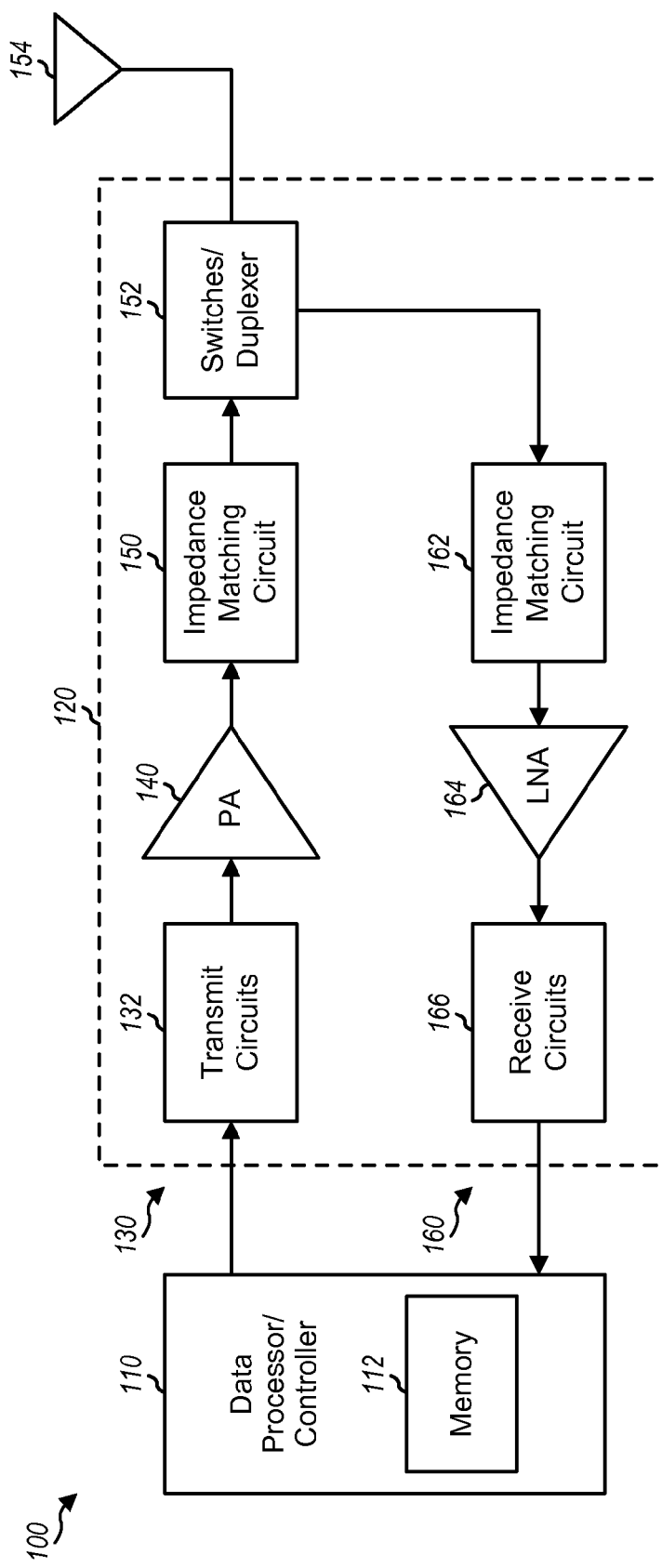
FIG. 1 shows a block diagram of a wireless device.

FIG. 1 shows a block diagram of an exemplary design of a wireless device 100. In this exemplary design, wireless device 100 includes a data processor/controller 110, a transceiver 120, and an antenna 154. Transceiver 120 includes a transmitter 130 and a receiver 160 that support bi-directional wireless communication. Wireless device 100 may support Long Term Evolution (LTE), Code Division Multiple Access (CDMA) 1X or cdma2000, Wideband CDMA (WCDMA), Global System for Mobile Communications (GSM), IEEE 802.11, etc.

In the transmit path, data processor 110 processes (e.g., encodes and modulates) data to be transmitted and provides an analog output signal to transmitter 130. Within transmitter 130, transmit circuits 132 amplify, filter, and upconvert the analog output signal from baseband to RF and provide a modulated RF signal. Transmit circuits 132 may include amplifiers, filters, mixers, an oscillator, a local oscillator (LO) generator, a phase locked loop (PLL), etc. A power amplifier (PA) 140 receives and amplifies the modulated RF signal and provides an amplified RF signal having the proper output power level. An impedance matching circuit 150 performs output impedance matching for power amplifier 140. Matching circuit 150 receives the amplified RF signal from power amplifier 140 and provides an output RF signal, which is routed through switches/duplexer 152 and transmitted via antenna 154.

In the receive path, antenna 154 receives signals from base stations and/or other transmitter stations and provides a received RF signal, which is routed through switches/duplexer 152 provided to receiver 160. Within receiver 160, an impedance matching circuit 162 performs input impedance matching for a low noise amplifier (LNA) 164. LNA 164 amplifies the received RF signal from matching circuit 162 and provides an amplified signal. Receive circuits 166 amplify, filter, and downconvert the amplified signal from RF to baseband and provide an analog input signal to data processor 110. Receive circuits 166 may include amplifiers, filters, mixers, an oscillator, a LO generator, a PLL, etc.

FIG. 1 shows an exemplary design of transmitter 130 and receiver 160. Transmitter 130 and/or receiver 160 may include different and/or additional circuits not shown in FIG. 1. For example, transmitter 130 may include a driver amplifier prior to power amplifier 140. All or a portion of transceiver 120 may be implemented on one or more analog integrated circuits (ICs), RF ICs (RFICs), mixed-signal ICs, etc. For example, transmit circuits 132, power amplifier 140, LNA 164, receive circuits 166, and matching circuits 150 and 162 may be implemented on an RFIC. Power amplifier 140 and possibly other circuits may also be implemented on a separate IC or circuit module. Matching circuit 150 and/or 162 and possibly other circuits may also be implemented on a separate IC or circuit module.

Data processor/controller 110 may perform various functions for wireless device 100. For example, data processor 110 may perform processing for data being transmitted via transmitter 130 and received via receiver 160. Controller 110 may control the operation of transmit circuits 132, receive circuits 166, power amplifier 140, matching circuit 150 and/or 162, switches/duplexer 152, etc. A memory 112 may store program codes and data for data processor/controller 110. Data processor/controller 110 may be implemented on one or more application specific integrated circuits (ASICs) and/or other ICs.

Power amplifier 140 within wireless device 100 may be implemented with a single-ended design or a differential design. A single-ended power amplifier receives a single-ended input signal and provides a single-ended output signal. A differential power amplifier receives a differential input signal and provides a differential output signal. A single-ended power amplifier may be simpler to implement since (i) a transformer is not needed to convert the output signal from differential to single-ended prior to transmission via an antenna and (ii) a power combiner is not needed.

Figure 2:
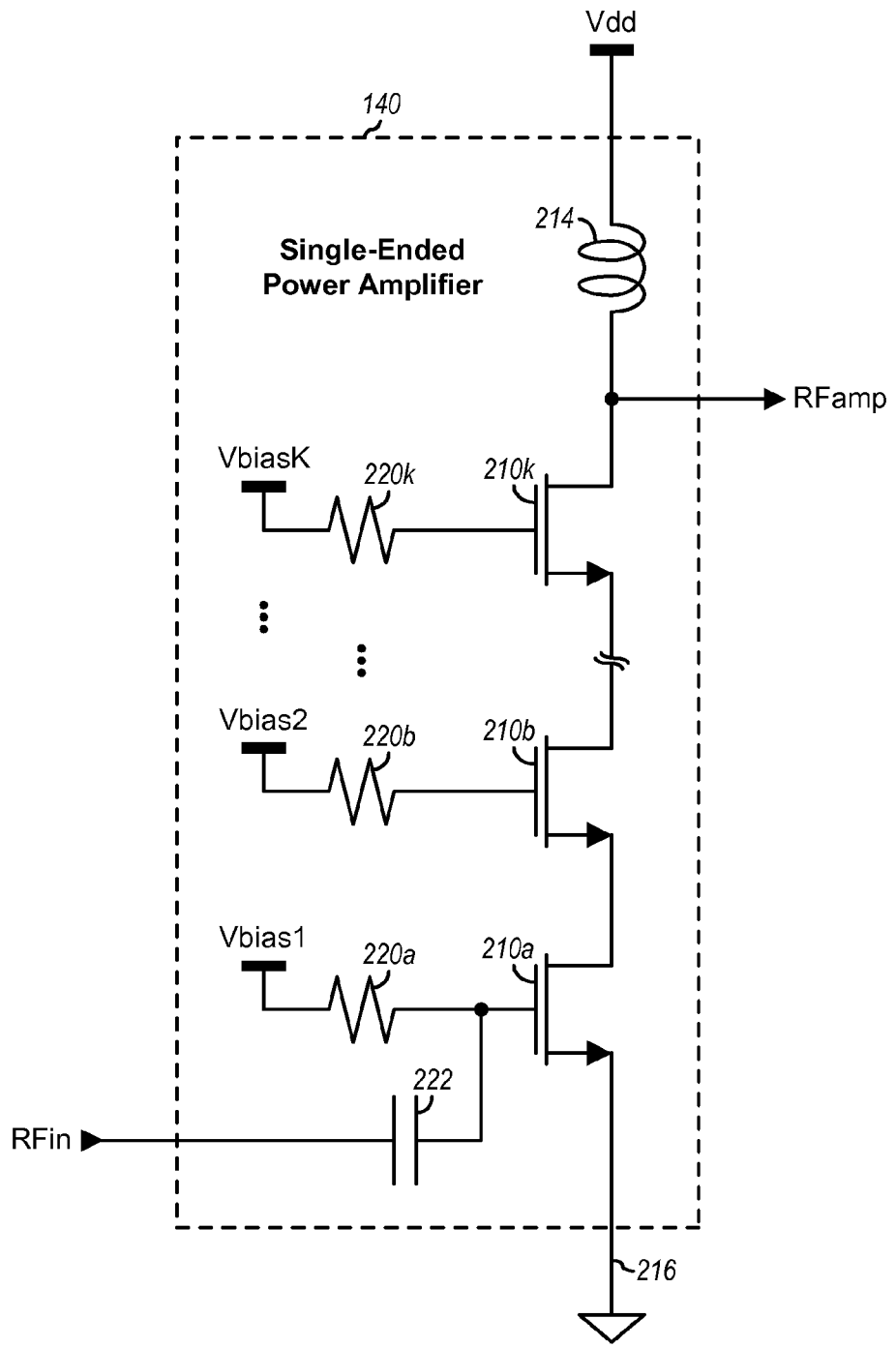
FIG. 2 shows a schematic diagram of a power amplifier.

FIG. 2 shows a schematic diagram of an exemplary design of single-ended power amplifier 140 in FIG. 1. Power amplifier 140 includes K N-channel metal oxide semiconductor (NMOS) transistors 210a through 210k coupled in a stack, where K may be any integer value. The bottommost NMOS transistor 210a is a gain transistor for power amplifier 140 and has (i) its source coupled to circuit ground via a connection 216 and (ii) its gate receiving an input RF signal (RFin) via an alternating current (AC) coupling capacitor 222. Each higher up NMOS transistor 210 in the stack has its source coupled to the drain of another NMOS transistor below in the stack. The topmost NMOS transistor 210k has its drain providing an amplified RF signal (RFamp). A load inductor 214 is coupled between a power supply (Vdd) and the drain of the topmost NMOS transistor 210k and provides direct current (DC) bias current for power amplifier 140. The gates of NMOS transistor 210a through 210k receive K bias voltages, Vbias1 through VbiasK, via K resistors 220a through 220k, respectively. The bias voltages may be generated to turn on power amplifier 140 when it is enabled and to turn off power amplifier 140 when it is disabled.

The amplified RF signal may have a large voltage swing, which may exceed a breakdown voltage of each NMOS transistor 210. The large voltage swing of the amplified RF signal may be split or distributed approximately equally across the K NMOS transistors 210a through 210k. Each NMOS transistor 210 may then observe only a fraction of the voltage swing of the amplified RF signal, which may be less than the breakdown voltage of each NMOS transistor in order to achieve high reliability. The K bias voltages Vbias1 through VbiasK may be selected to provide the desired voltage splitting of the amplified RF signal, e.g., so that each NMOS transistor observes approximately 1/K-th of the voltage swing.

FIG. 2 shows an exemplary design of a single-ended power amplifier, which may also be implemented in other manners. For example, a single-ended power amplifier may be implemented with transistors of other types, or with other circuit topologies, etc.

Figure 3:
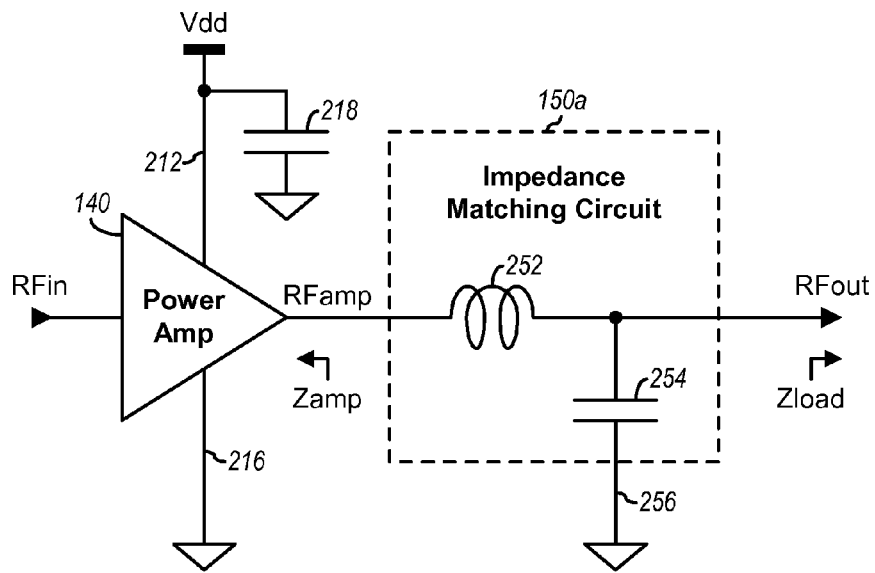
FIG. 3 shows an impedance matching circuit coupled to the power amplifier.

FIG. 3 shows a schematic diagram of an impedance matching circuit 150a, which is an exemplary design of impedance matching circuit 150 in FIG. 1. In this exemplary design, matching circuit 150a includes a series inductor 252 and a shunt capacitor 254. Inductor 252 is coupled between the input and output of matching circuit 150a. Capacitor 254 is coupled between the output of matching circuit 150a and circuit ground via a connection 256.

Power amplifier 140 is coupled to circuit ground via connection 216. Power amplifier 140 is also coupled to the Vdd supply via a connection 212. A bypass capacitor 218 is coupled between the Vdd supply and circuit ground and provides filtering of high frequency noise on the Vdd supply.

Referring back to FIG. 2, power amplifier 140 includes a gain transistor 210a having its source connected to circuit ground via connection 216. Connection 216 inherently includes parasitic inductance, which may result from routing traces, thru-vias, and/or bond wires used to implement connection 216. The parasitic inductance acts as source degeneration inductance that can reduce the gain of power amplifier 140.

In general, an amplifier (e.g., power amplifier 140 in FIG. 2) inherently has some source degeneration inductance at the source of a gain transistor (e.g., NMOS transistor 210a in FIG. 2). The source degeneration inductance arises because it is not physically possible to achieve a zero Ohms connection between the source of the gain transistor and its circuit ground. The amount of source degeneration inductance is dependent on the interconnection between the source of the gain transistor and circuit ground. This interconnection may be composed of routing traces, thru-vias, bond wires, etc.

Figure 4:
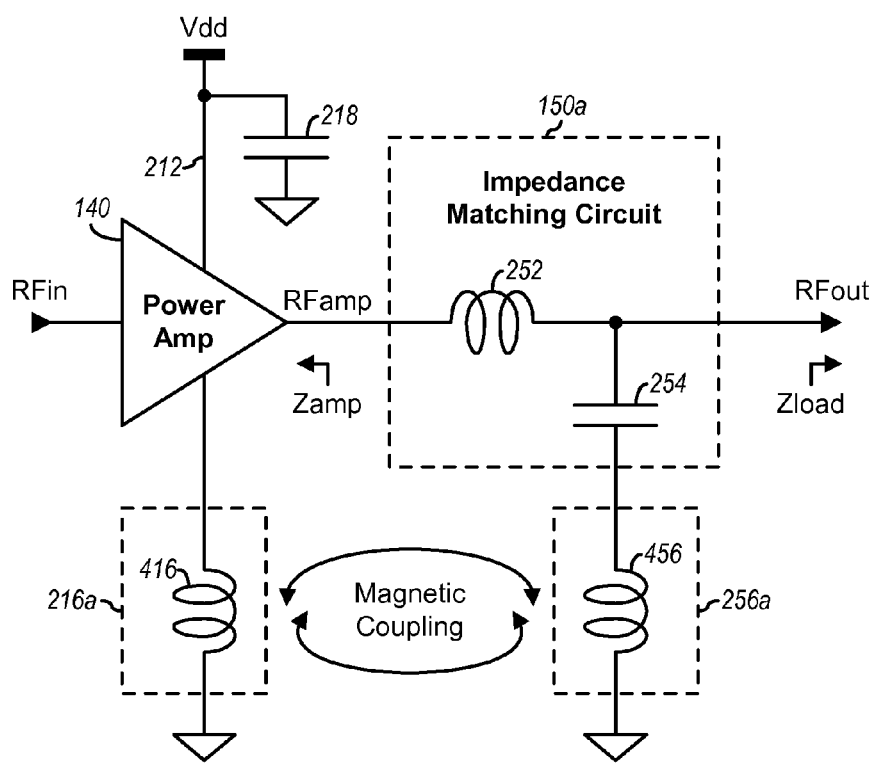
FIG. 4 shows the power amplifier with reduced source degeneration inductance.

FIG. 4 shows a schematic diagram of an exemplary design of power amplifier 140 with reduced source degeneration inductance. In the exemplary design shown in FIG. 4, a ground connection 216a is one exemplary implementation of ground connection 216 for power amplifier 140, and a ground connection 256a is one exemplary implementation of ground connection 256 for capacitor 254 within matching circuit 150a in FIG. 3. Ground connection 216a includes a parasitic inductance 416 acting as a source degeneration inductance for power amplifier 140. Ground connection 256a includes a parasitic inductance 456 that is magnetically coupled to parasitic inductance 416.

As shown in FIG. 4, power amplifier 140 having reduced source degeneration inductance may be obtained by magnetically coupling the undesired source degeneration inductance 416 of ground connection 216a of power amplifier 140 with parasitic inductance 456 of ground connection 256a of impedance matching circuit 150a. Power amplifier 140 may provide an amplified RF signal to matching circuit 150a, and a large portion of the amplified RF signal may flow through parasitic inductance 456 of ground connection 256a of matching circuit 150a. By magnetically coupling the undesired source degeneration inductance 416 of power amplifier 140 with parasitic inductance 456 of matching circuit 150a, the undesired source degeneration inductance 416 of power amplifier 140 may be effectively reduced, and the gain of power amplifier 140 may be improved.

In an exemplary design, ground connection 256 of capacitor 254 may be located within a predetermined distance of ground connection 216 of power amplifier 140. The predetermined distance may be dependent on circuit applications. In a circuit application in which power amplifier 140 is heavily limited by source degeneration, ground connection 256 of capacitor 254 may be located as close as possible to ground connection 216 of power amplifier 140. In a circuit application in which power amplifier 140 is less sensitive to source degeneration, the distance between ground connections 216 and 256 may be larger. The amount of source degeneration left after magnetic coupling may be approximated as follows:

$$L_{degen\_with\_coupling} = (1 - k_{factor}) * L_{degen\_without\_coupling}, \quad \text{Eq (1)}$$

where $L_{degen\_without\_coupling}$ is the degeneration inductance without coupling, $L_{degen\_with\_coupling}$ is the degeneration inductance with coupling, and $k_{factor}$ is a coupling factor between ground connections 216 and 256.

Equation (1) is based on several assumptions. In particular, equation (1) assumes that the currents flowing through ground connections 216 and 256 are identical in magnitude and that parasitic inductances 416 and 456 are identical. Equation (1) may be modified for a more general case, e.g., when any one of the above assumptions does not hold.

Figure 5:
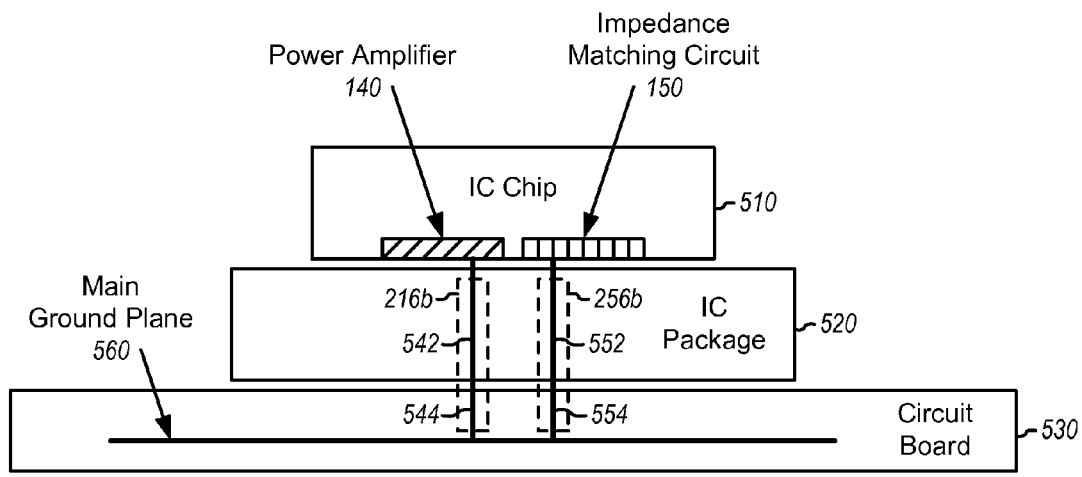
FIG. 5 shows an implementation of the power amplifier and the impedance matching circuit.

FIG. 5 shows an exemplary design of power amplifier 140 and impedance matching circuit 150 in FIG. 1. In this exemplary design, power amplifier 140 and matching circuit 150 are implemented on an IC chip 510. IC chip 510 is mounted on an IC package 520 using flip-chip technology. IC package 520 is mounted on a circuit board 530.

A main/reference ground plane 560 is formed on circuit board 530. Power amplifier 140 is connected to the main ground plane 560 via an electrical connection 542 through IC package 520 and an electrical connection 544 on circuit board 530. A ground connection 216b for power amplifier 140 includes electrical connections 542 and 544 and possibly other electrical connections. Ground connection 216b is another exemplary implementation of ground connection 216 in FIGS. 2 and 3. Impedance matching circuit 150 is connected to the main ground plane 560 via an electrical connection 552 through IC package 520 and an electrical connection 554 on circuit board 530. A ground connection 256b for matching circuit 150 includes electrical connections 552 and 554 and possibly other electrical connections. Ground connection 256b is another exemplary implementation of ground connection 256 in FIG. 3.

In general, a circuit (e.g., a power amplifier or an impedance matching circuit) may be connected to circuit ground via on-chip, on-package, and/or on-board electrical connections. An electrical connection may include routing traces, thru-vias, bond wires, etc. Each electrical connection is associated with certain impedance, which may be inductive in nature.

Power amplifier 140 may inherently include undesired source degeneration inductance due to parasitic inductances associated with connection 216. The source degeneration inductance may substantially reduce the gain of power amplifier 140 and may severely limit the amplifier performance. The source degeneration inductance may thus be highly undesirable in gain sensitive applications and/or in IC technologies where the available amplifier gain barely meets design requirements.

Figure 6:
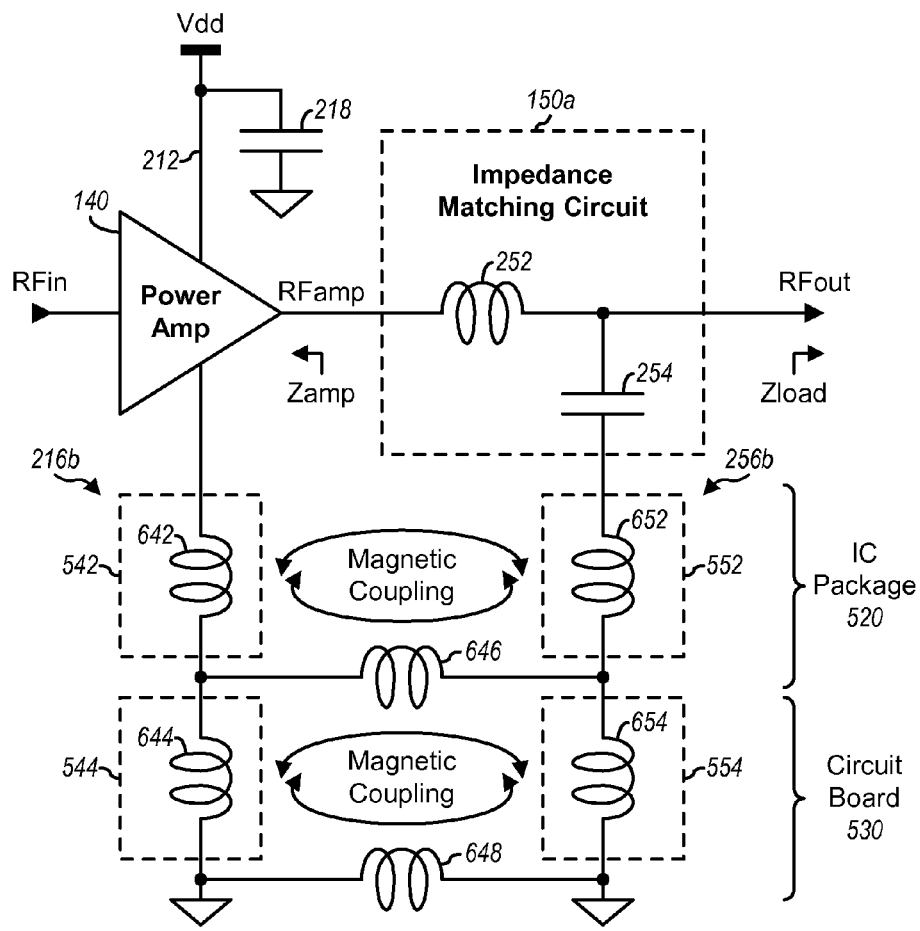
FIG. 6 shows the power amplifier with reduced source degeneration inductance for the implementation shown in FIG. 5.

FIG. 6 shows a schematic diagram of another exemplary design of power amplifier 140 with reduced source degeneration inductance. In the exemplary design shown in FIG. 6, power amplifier 140 is coupled to circuit ground via ground connection 216b through IC package 520 and circuit board 530. Ground connection 216b includes (i) electrical connection 542 (e.g., a thru-via) through IC package 520 that is modeled by a parasitic inductance 642 and (ii) electrical connection 544 (e.g., another thru-via) through circuit board 530 that is modeled by a parasitic inductance 644. Parasitic inductances 642 and 644 act as undesired source degeneration inductance of power amplifier 140. Capacitor 254 in matching circuit 150a is coupled to circuit ground via ground connection 256b through IC package 520 and circuit board 530. Ground connection 256b includes (i) electrical connection 552 (e.g., a thru-via) through IC package 520 that is modeled by a parasitic inductance 652 and (ii) electrical connection 554 (e.g., another thru-via) through circuit board 530 that is modeled by a parasitic inductance 654. For flip-chip technology, parasitic inductances may be formed by vertical structures found in IC package 520 that connect ground planes on IC chip 510 to the main ground plane 560 on circuit board 530 or some package inner layer defined as circuit ground by a circuit designer.

Within IC package 520, a parasitic inductance 646 models the ground connection between power amplifier 140 and capacitor 254. Within circuit board 530, a parasitic inductance 648 models the ground connection between power amplifier 140 and capacitor 254.

As shown in FIG. 6, parasitic inductance 652 may be magnetically coupled to parasitic inductance 642 on IC package 520. Parasitic inductance 654 may be magnetically coupled to parasitic inductance 644 on circuit board 530. Parasitic inductances 642, 644, 652 and 654 may be formed by ground thru-vias on IC package 520 and circuit board 530. Hence, magnetic coupling of parasitic inductances on only IC package 520, or only circuit board 530, or both IC package 520 and circuit board 530 may be achieved by proper placement of the ground thru-vias.

As shown in FIG. 6, power amplifier 140 having reduced source degeneration inductance may be obtained by magnetically coupling the undesired source degeneration inductances 642 and 644 of ground connection 216b of power amplifier 140 with parasitic inductances 652 and 654 of ground connection 256b of impedance matching circuit 150a coupled to power amplifier 140. Power amplifier 140 may provide an amplified RF signal to matching circuit 150a, and a large portion of the amplified RF signal may flow through parasitic inductances 652 and 654 of ground connection 256b of matching circuit 150a. By magnetically coupling the undesired source degeneration inductances 642 and 644 of power amplifier 140 with parasitic inductances 652 and 654 of matching circuit 150a, the undesired source degeneration inductances 642 and 644 of power amplifier 140 may be effectively reduced, and the gain of power amplifier 140 may be improved.

Figure 7:
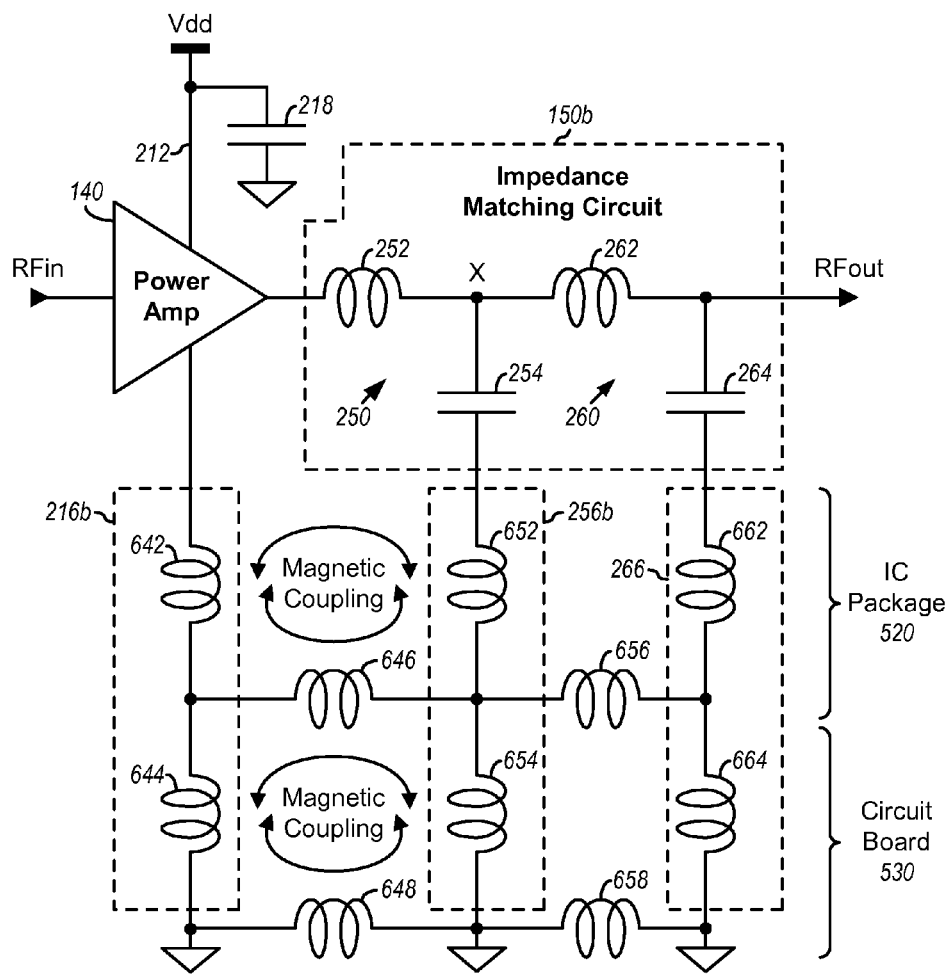
FIG. 7 shows the power amplifier with reduced source degeneration inductance for a two-stage impedance matching circuit.

FIG. 7 shows a schematic diagram of an exemplary design of power amplifier 140 with reduced source degeneration inductance and an impedance matching circuit 150b. Matching circuit 150b is another exemplary design of matching circuit 150 in FIG. 1 and includes two L sections 250 and 260. The first L section 250 includes series inductor 252 and shunt capacitor 254, and the second L section 260 includes a series inductor 262 and a shunt capacitor 264. Inductor 252 is coupled between the input of matching circuit 150b and an intermediate node X. Capacitor 254 is coupled between node X and circuit ground via connection 256b. Inductor 262 is coupled between node X and the output of matching circuit 150b. Capacitor 264 is coupled between the output of matching circuit 150b and circuit ground via a connection 266. In general, a matching circuit may include any number of sections, and each section may be implemented with an L topology (as shown in FIG. 7) or some other circuit topology.

As shown in FIG. 7, power amplifier 140 is coupled to circuit ground via ground connection 216b, which includes parasitic inductance 642 on IC package 520 and parasitic inductance 644 on circuit board 530. Capacitor 254 in the first L section 250 is coupled to circuit ground via ground connection 256b, which includes parasitic inductance 652 on IC package 520 and parasitic inductance 654 on circuit board 530. Capacitor 264 in the second L section 260 is coupled to circuit ground via ground connection 266, which includes a parasitic inductance 662 on IC package 520 and a parasitic inductance 664 on circuit board 530.

Within IC package 520, parasitic inductance 646 models the ground connection between power amplifier 140 and capacitor 254. A parasitic inductance 656 models the ground connection between capacitors 254 and 264. Within circuit board 530, parasitic inductance 648 models the ground connection between power amplifier 140 and capacitor 254. A parasitic inductance 658 models the ground connection between capacitors 254 and 264.

As shown in FIG. 7, parasitic inductance 652 may be magnetically coupled to parasitic inductance 642 on IC package 520. Parasitic inductance 662 may also be magnetically coupled to parasitic inductance 642 on IC package 520 (not shown in FIG. 7). The magnetic coupling between inductances 642 and 662 may be less than the magnetic coupling between inductances 642 and 652. As shown in FIG. 7, parasitic inductance 654 may be magnetically coupled to parasitic inductance 644 on circuit board 530. Parasitic inductance 664 may also be magnetically coupled to parasitic inductance 644 on circuit board 530 (not shown in FIG. 7). The magnetic coupling between inductances 644 and 664 may be less than the magnetic coupling between inductances 644 and 654.

An output impedance (Zamp) of power amplifier 140 is typically much lower than a load impedance (Zload) at the output of impedance matching circuit 150. The load impedance may be the impedance of antenna 154 or duplexer 152 in FIG. 1. Since the amplifier output impedance is much smaller than the load impedance, impedance matching circuit 150 may be designed such that impedance grows after each L section of the matching circuit. For the 2-stage design shown in FIG. 7, matching circuit 150b may be designed such that the impedance at node X (Zx) is greater than the amplifier output impedance but less than the load impedance, or Zamp<Zx<Zload. For example, matching circuit 150b may be designed such that the impedance at node X is geometrically between Zamp and Zload, or Zx≈√Zamp*Zload, in order to obtain the maximum bandwidth. In any case, since the impedance at node X is less than the load impedance, most of the current of the amplified RF signal from power amplifier 140 may flow through inductor 252 and capacitor 254 in the first L section 250. Capacitor 254 may be connected to circuit ground via connection 256b, which may be placed as close as possible to connection 216b from power amplifier 140 to circuit ground. By placing ground connection 256b of capacitor 254 close to ground connection 216b of power amplifier 140, higher magnetic coupling may be achieved between parasitic inductances 642 and 652 and also between parasitic inductances 644 and 654. The higher magnetic coupling may reduce the source degeneration inductance of power amplifier 140, which may in turn improve the gain of the power amplifier.

Figure 8A:
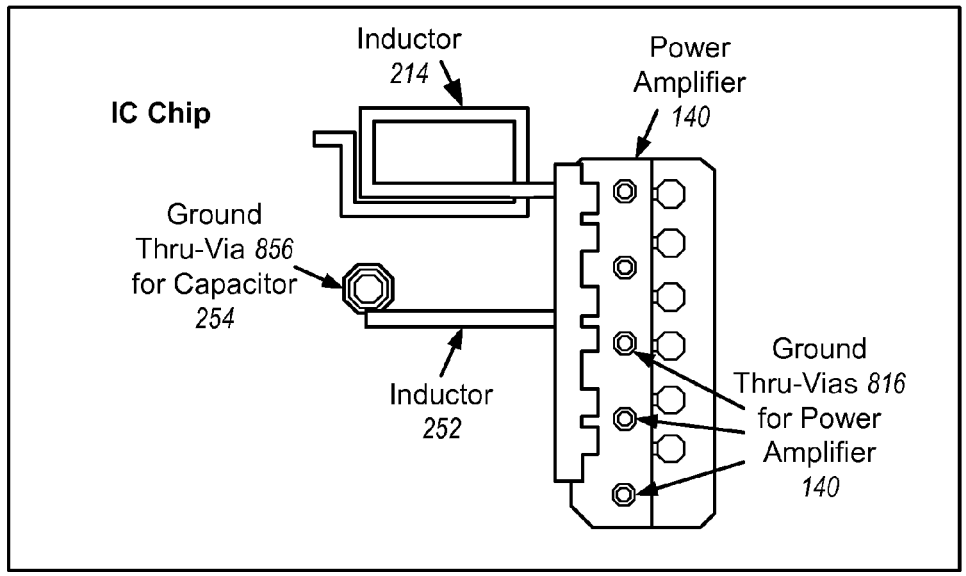
FIGS. 8A and 8B show exemplary partial layouts of the power amplifier without and with reduced source degeneration inductance.

FIG. 8A shows an exemplary partial layout of power amplifier 140 and impedance matching circuit 150a or 150b. In this exemplary partial layout, power amplifier 140 includes a set of electrical connections/ground thru-vias 816 to circuit ground, which may be part of connection 216 in FIG. 2. Inductor 214 is coupled between the drain of the topmost transistor in power amplifier 140 (which is also the output of power amplifier 140) and the Vdd supply (not shown in FIG. 8A). Inductor 252 within impedance matching circuit 150a or 150b is coupled between the output of power amplifier 140 and an intermediate node. Capacitor 254 (not shown in FIG. 8A) is coupled between the end of inductor 252 and an electrical connection/ground thru-via 856 to circuit ground, which may be part of connection 256a in FIG. 4 or connection 256b in FIG. 6. The magnetic coupling between the source degeneration/parasitic inductance due to electrical connections 816 for power amplifier 140 and the parasitic inductance due to electrical connection 856 for capacitor 254 may be relatively weak due to a relatively large distance between electrical connections 816 and 856.

Figure 8B:
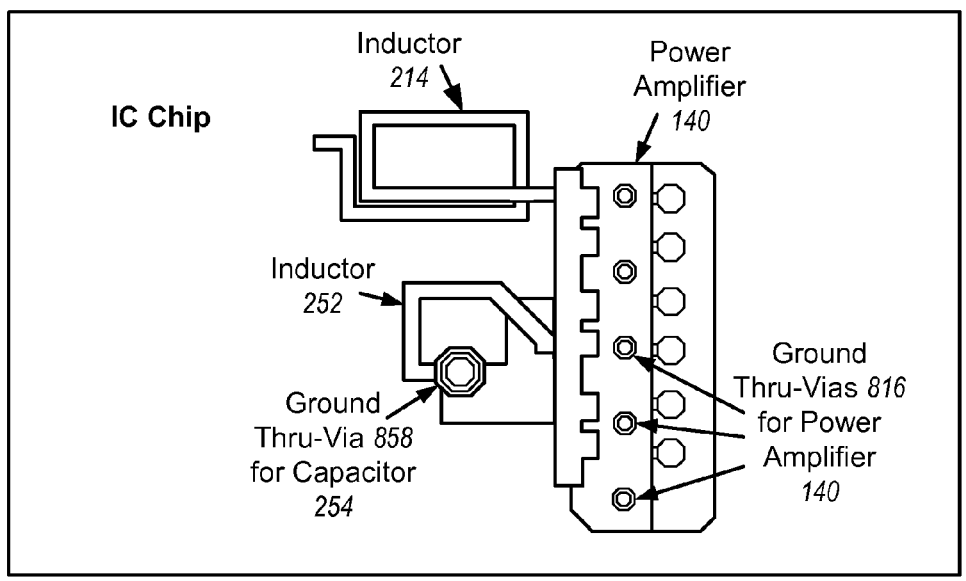

FIG. 8B shows an exemplary partial layout of power amplifier 140 with reduced source degeneration inductance. In this exemplary partial layout, power amplifier 140 includes electrical connections/ground thru-vias 816 to circuit ground. Inductor 252 within impedance matching circuit 150a or 150b is coupled between the output of power amplifier 140 and an intermediate node. Capacitor 254 (not shown in FIG. 8B) is coupled between the end of inductor 252 and an electrical connection/ground thru-via 858 to circuit ground, which may be part of connection 256a in FIG. 4 or connection 256b in FIG. 6. The magnetic coupling between the source degeneration/parasitic inductance due to electrical connections 816 for power amplifier 140 and the parasitic inductance due to electrical connection 858 for capacitor 254 may be stronger due to a shorter distance between electrical connections 816 and 858. By placing electrical connection 858 of capacitor 254 (i.e., the first shunt circuit component in matching circuit 150) close to electrical connections 816 of power amplifier 140, the contribution to the source degeneration inductance of power amplifier 140 may be significantly reduced, which may increase the gain of power amplifier 140.

As shown in FIG. 8B, separated ground thru-vias/bumps may be present—one or more ground thru-vias for the ground connection for power amplifier 140 and one or more other ground thru-vias for the ground connection for the capacitor 254 (or the first shunt circuit component of matching circuit 150). These ground thru-vias may be placed close together to improve magnetic coupling between the source degeneration inductance of power amplifier 140 and the parasitic inductance of capacitor 254. The circuit components of matching circuit 150 may occupy a relatively large area and may be arranged such that the ground thru-vias can be placed closer together, as shown in FIG. 8B.

The ground connection for capacitor 254 may be placed closer to the ground connection for power amplifier 140 to reduce source degeneration inductance of the power amplifier. However, the closer placement of the ground connection for capacitor 254 may impact the value of inductor 252. Inductor 252 as well as the parasitic inductance of ground connection 256 for capacitor 254 may be designed to obtain the desired impedance matching and to implement a desired load line for power amplifier 140. In general, it may be desirable to reduce mutual coupling between inductor 252 and the parasitic inductances due to ground connection 256 for capacitor 254.

For clarity, FIGS. 8A and 8B show partial layout of only some circuit components in power amplifier 140 and matching circuit 150. Other circuit components such as inductor 262 and capacitor 264 may be formed at appropriate location in the layout to achieve good performance.

Figure 9:
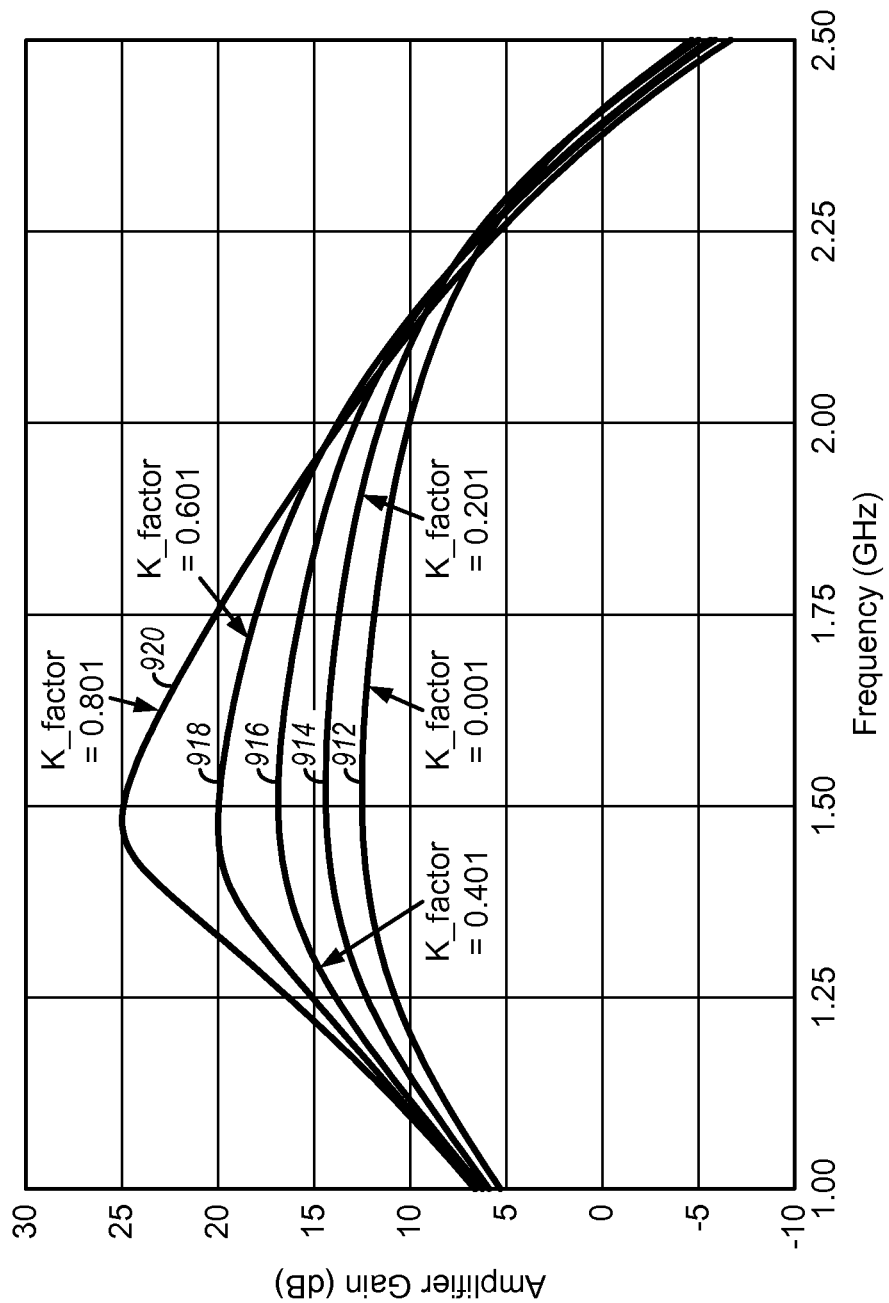
FIG. 9 shows plots of the gain of the power amplifier for different amounts of reduction in source degeneration inductance.

FIG. 9 shows plots of the gain of power amplifier 140 for different amounts of magnetic coupling between the source degeneration inductance of power amplifier 140 and the parasitic inductance of the ground connection for capacitor 254. In FIG. 9, the horizontal axis denotes frequency and is given in units of giga-Hertz (GHz). The vertical axis denotes the gain of power amplifier 140 and is given in units of decibels (dB). The amplifier gain is also referred to as a S21 transfer function of power amplifier 140. The amount of magnetic coupling is denoted by a coupling factor, K_factor.

A plot 912 shows the amplifier gain for the case of almost no magnetic coupling with K_factor=0.001. A plot 914 shows the amplifier gain for the case of small magnetic coupling with K_factor=0.201. A plot 916 shows the amplifier gain for the case of K_factor=0.401. A plot 918 shows the amplifier gain for the case of K_factor=0.601. A plot 920 shows the amplifier gain for the case of more magnetic coupling with K_factor=0.801.

As shown by plot 912 in FIG. 9, the amplifier gain may be limited due to undesired source degeneration inductance of power amplifier 140. As shown by plots 914 to 920 in FIG. 9, the amplifier gain may be improved with progressively more magnetic coupling between the source degeneration inductance of power amplifier 140 and the parasitic inductance of the ground connection for capacitor 254. FIG. 9 shows that substantial improvement (e.g., of up to 12 dB) in amplifier gain may be achieved using the techniques described herein for reducing source degeneration inductance.

The techniques for reducing source degeneration inductance may be used for a power amplifier, as described above. The techniques may be especially applicable for a single-ended power amplifier, which may have ground connections to off-chip main ground and may be more likely to observe large undesired source degeneration inductances due to electrical connections via IC chip, IC package, and/or circuit board. The techniques may also be used for amplifiers of other types as well as for other active circuits in which higher gain is desirable.

In an exemplary design, an apparatus (e.g., a wireless device, an IC, an IC package, a circuit module, a circuit board, etc.) may comprise first and second connections. The first connection (e.g., connection 216a in FIG. 4 or connection 216b in FIG. 6) may include a first parasitic inductance acting as a source degeneration inductance of an amplifier. The second connection (e.g., connection 256a in FIG. 4 or connection 256b in FIG. 6) may include a second parasitic inductance magnetically coupled to the first parasitic inductance to reduce the source degeneration inductance of the amplifier. The amplifier (e.g., power amplifier 140 in FIG. 2) may be coupled to circuit ground via the first connection. An impedance matching circuit (e.g., matching circuit 150 in FIG. 3) may be coupled to the amplifier and may comprise a circuit component (e.g., capacitor 254 in FIG. 3) coupled to circuit ground via the second connection. The first parasitic inductance may include inductance 416 in FIG. 4, or inductances 642 and 644 in FIG. 6, etc. The second parasitic inductance may include inductance 456 in FIG. 4, or inductances 652 and 654 in FIG. 6, etc.

The first connection may be located sufficiently close to the second connection in order to obtain the desired magnetic coupling between the first and second parasitic inductances. In an exemplary design, the first connection may be located within a predetermined distance of the second connection.

In one exemplary design, the amplifier may comprise a single-ended power amplifier (e.g., power amplifier 140 in FIG. 2) configured to receive a single-ended input signal and provide a single-ended output signal. The single-ended power amplifier may comprise a transistor (e.g., NMOS transistor 210a in FIG. 2) providing gain for the single-ended power amplifier and having a source coupled to circuit ground via the first connection.

The impedance matching circuit may comprise a first section coupled to the amplifier. The first section may comprise the circuit component coupled to circuit ground via the second connection to circuit ground. In one exemplary design, the first section may comprise a series inductor and a shunt capacitor. The series inductor (e.g., inductor 252 in FIG. 4 or 7) may be coupled to the amplifier and a node (e.g., the output of the matching circuit in FIG. 4 or node X in FIG. 7). The shunt capacitor (e.g., capacitor 254 in FIG. 4 or 7) may be coupled to the node and the second connection to circuit ground. The circuit component may comprise the shunt capacitor. The impedance matching circuit may further comprise at least one additional section (e.g., section 260 in FIG. 7) coupled in series with the first section. An impedance at an output of the first section may be greater than an output impedance of the amplifier and may be less than a load impedance.

In an exemplary design, the amplifier may be fabricated on an IC chip mounted on an IC package, e.g., with flip-chip technology as shown in FIG. 5, or with a package routing layer and solder balls for direct board mounting, etc. The first connection may include electrical connections on the IC chip and the IC package to circuit ground. The IC package may be mounted on a circuit board. The first connection may further include electrical connections on the circuit board to circuit ground. The second parasitic inductance may be magnetically coupled to the first parasitic inductance via the IC chip, the IC package, and/or the circuit board.

Figure 10:
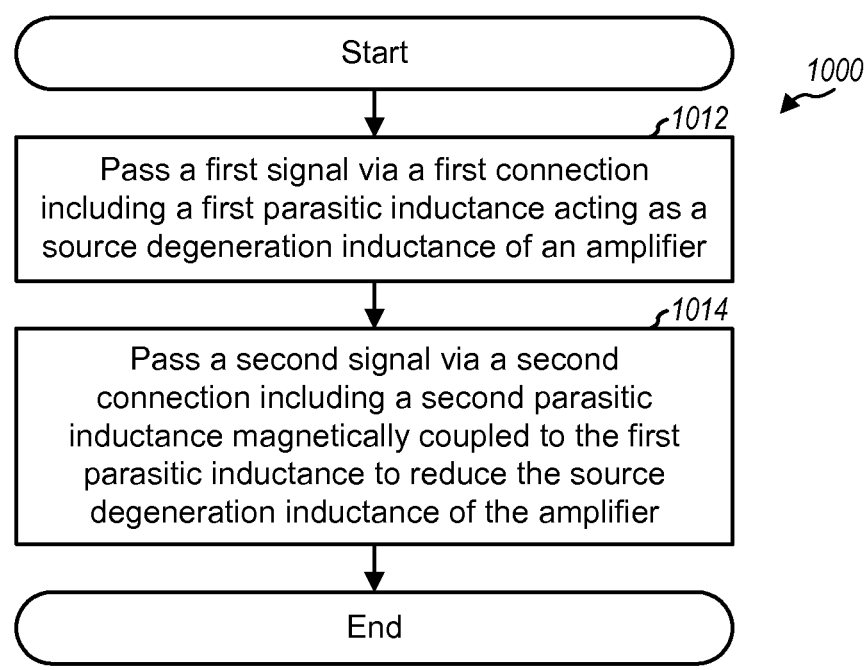
FIG. 10 shows a process for reducing source degeneration inductance.

FIG. 10 shows an exemplary design of a process 1000 for reducing source degeneration inductance. A first signal may be passed via a first connection including a first parasitic inductance acting as a source degeneration inductance of an amplifier (block 1012). A second signal may be passed via a second connection including a second parasitic inductance magnetically coupled to the first parasitic inductance to reduce the source degeneration inductance of the amplifier (block 1014). The amplifier may be a single-ended power amplifier and may be impedance matched with an impedance matching circuit comprising a circuit component coupled to circuit ground via the second connection.

An amplifier with reduced source degeneration inductance described herein may be implemented on an IC, an analog IC, an RFIC, a mixed-signal IC, an ASIC, a printed circuit board (PCB), an electronic device, etc. An amplifier with reduced source degeneration inductance may be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an amplifier with reduced source degeneration inductance described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a first connection including a first parasitic inductance acting as a source degeneration inductance of an amplifier;
   a second connection including a second parasitic inductance magnetically coupled to the first parasitic inductance to reduce the source degeneration inductance of the amplifier; and
   an impedance matching circuit comprising a series inductor coupled between an output of the amplifier and an intermediate node and a shunt capacitor coupled between the intermediate node and a circuit ground via the second parasitic inductance.

2. The apparatus of claim 1, the amplifier comprising a power amplifier.

3. The apparatus of claim 1, the amplifier comprising a single-ended power amplifier configured to receive a single-ended input signal and provide a single-ended output signal.

4. The apparatus of claim 3, the single-ended power amplifier comprising a transistor providing gain for the single-ended power amplifier and having a source coupled to circuit ground via the first connection.

5. The apparatus of claim 1, the impedance matching circuit further comprising at least one additional section coupled in series with the first section, an impedance at an output of the first section being greater than an output impedance of the amplifier and less than a load impedance.

6. The apparatus of claim 1, the first connection being located within a predetermined distance of the second connection.

7. The apparatus of claim 1, the amplifier being fabricated on an integrated circuit (IC) chip mounted on an IC package, and the first connection including electrical connections on the IC chip and the IC package to circuit ground.

8. The apparatus of claim 7, the IC package being mounted on a circuit board, and the first connection further including an electrical connection on the circuit board to circuit ground.

9. The apparatus of claim 8, the second parasitic inductance being magnetically coupled to the first parasitic inductance via at least one of the IC chip, the IC package, or the circuit board.

10. The apparatus of claim 7, the IC chip being mounted on the IC package with flip-chip technology.

11. A method comprising:
    passing a first signal via a first connection including a first parasitic inductance acting as a source degeneration inductance of an amplifier;
    passing a second signal via a second connection including a second parasitic inductance magnetically coupled to the first parasitic inductance to reduce the source degeneration inductance of the amplifier; and
    passing an output signal of the amplifier via an impedance matching circuit which comprises a series inductor coupled between an output of the amplifier and an intermediate node and a shunt capacitor coupled between the intermediate node and a circuit ground via the second parasitic inductance.

12. The method of claim 11, the amplifier comprising a single-ended power amplifier.

13. The method of claim 11, the first connection being located within a predetermined distance of the second connection.

14. An apparatus comprising:
    means for passing a first signal via a first connection including a first parasitic inductance acting as a source degeneration inductance of means for amplifying;
    means for passing a second signal via a second connection including a second parasitic inductance magnetically coupled to the first parasitic inductance to reduce the source degeneration inductance of the means for amplifying; and
    means for passing an output signal of the means for amplifying via an impedance matching circuit which comprises a series inductor coupled between an output of the means for amplifying and an intermediate node and a shunt capacitor coupled between the intermediate node and a circuit ground via the second parasitic inductance.

15. The apparatus of claim 14, the means for amplifying comprising means for amplifying a single-ended input signal to obtain a single-ended output signal.

16. The apparatus of claim 14, the first connection being located within a predetermined distance of the second connection.

* * * * *